United States Patent [19]

Luryi

[11] Patent Number: 5,496,743
[45] Date of Patent: Mar. 5, 1996

[54] METHOD OF MAKING AN ARTICLE COMPRISING A SEMICONDUCTOR DEVICE

[75] Inventor: Serge Luryi, Bridgewater, N.J.

[73] Assignee: AT&T Corp., Murray Hill, N.J.

[21] Appl. No.: 171,504

[22] Filed: Dec. 21, 1993

Related U.S. Application Data

[63] Continuation-in-part of Ser. No. 843,654, Feb. 28, 1992, Pat. No. 5,309,003.

[51] Int. Cl.$^6$ .................................................. H01L 21/02
[52] U.S. Cl. ........................... 437/31; 437/133; 437/204; 437/974; 148/DIG. 135
[58] Field of Search ............................. 437/31, 133, 184, 437/204, 974, 126, 915; 148/DIG. 135

[56] References Cited

U.S. PATENT DOCUMENTS

| | | | |
|---|---|---|---|
| 4,339,870 | 7/1982 | Ball et al. | 437/133 |
| 4,675,717 | 6/1987 | Herrero et al. | 357/71 |
| 5,318,916 | 6/1994 | Enquist et al. | 437/31 |

OTHER PUBLICATIONS

"Heterojunction Band Discontinuities: Physics and Device Applications", edited by F. Capasso et al., Elsevier 1987, pp. 153–539.

"Improved Microwave Performance in Transistors Based on Real Space Electron Transfer", by M. R. Hueschen et al., *Applied Physics Letters*, vol. 57(4), Jul. 23, 1990, pp. 386–388.

"High–Frequency Characteristics of Charge–Injection Transistor–Mode Operation in AlGaAs/InGaAs/GaAs Metal–Insulator–Semiconductor Field–Effect Transistors", by K. Maezawa et al., *Japanese Journal of Applied Physics*, vol. 30(6), Jun. 6, 1991, pp. 1190–1193.

"Heterostructure Bipolar Transistors and Integrated Circuits", by H. Kroemer, *Proceedings of the IEEE*, vol. 70, No. 1, Jan. 1982, pp. 13–25.

"Consideration of the Relative Frequency Performance Potential of Inverted Heterojunction n–p–n Transistors", by C. G. Fonstad, *IEEE Electron Device Letters*, vol. EDL–5(3), Mar. 1984, pp. 99–100.

"InGaAs/InAlAs/InP Collector–Up Microwave Heterojunction Bipolar Transistors", by H. A. Sato et al., *IEEE Electron Device Letters*, vol. 11(10), Oct. 10, 1990, pp. 457–459.

"Light–emitting Devices Based on the Real–Space Transfer of Hot Electrons", by S. Luryi, *Applied Physics Letters*, vol. 58(16), Apr. 22, 1991, pp. 1727–1729.

"A 144 GHz InP/InGaAs Composite Collector Heterostructure Bipolar Transistor", by A Feygenson et al., *IEDM Technical Digest*, (1992), pp. 75–78.

"GaAs 850 nm Modulators Solder–Bonded to Silicon", by K. W. Goossen et al., *IEEE Photonics Technology Letters*, vol. 5(7), Jul. 1993, pp. 776–778.

"Ultra High Conductivity at Room Temperature in Ozidized Polypropylene", by V. M. Arkhangorodskii et al., *JETP Letters*, vol. 51, No. 1, Jan. 10, 1990, pp. 67–72.

(List continued on next page.)

*Primary Examiner*—Brian E. Hearn
*Assistant Examiner*—Tuan Nguyen
*Attorney, Agent, or Firm*—Eugen E. Pacher

[57] ABSTRACT

A Novel method of making a semiconductor device (e.g., a HBT) is disclosed. A semiconductor body that comprises bulk semiconductor material and epitaxial semiconductor material on the bulk material is processed by carrying out a first sequence of processing steps on the epitaxial material. The sequence comprises forming at least first and second contact means on the epitaxial material. The resulting intermediate body is mounted, epitaxial material down, on a carrier body (e.g., a Si wafer with integrated circuitry thereon), such that the first and second contact means are electrically connected to, respectively, third and fourth contact means on the carrier body. Mounting is accomplished, exemplarily, by means of anisotropically conductive adhesive means. Subsequent to mounting of the intermediate body on the carrier body, a second sequence of processing steps is carried out on the intermediate body. The second sequence comprises removing, in at least a portion of the mounted intermediate body, essentially all bulk semiconductor material. The inventive method can be used to produce, for instance, a very fast HBT of novel geometry.

8 Claims, 7 Drawing Sheets

OTHER PUBLICATIONS

"Array Technology", by R. Tang et al., *Proceedings of the IEEE,* vol. 80, No. 1, Jan. 1992, pp. 173–182.

"An Antenna Beam Steering Technique Comprised of Constant–Phase Array Elements", by J. P. Costas, *Proceedings of the IEEE,* vol. 69, No. 6, Jun. 1981, pp. 745–747.

"500 GHz Electrically Steerable Photoconducting Antenna Array", by N. Froberg et al., *Applied Physics Letters,* vol. 58, Feb. 4, 1991, pp. 446–448.

METHOD OF MAKING AN ARTICLE COMPRISING A SEMICONDUCTOR DEVICE

This application is a continuation-in-part of application Ser. No. 07/843,654, filed Feb. 28, 1992, now U.S. Pat. No. 5,309,003.

FILED OF THE INVENTION

This invention pertains to articles comprising semiconductor devices, including electronic and opto-electronic devices, and to methods of making such articles.

BACKGROUND OF THE INVENTION

Real space transfer (RST) semiconductor devices are known in the art. See, for instance, S. Luryi's chapter in "Heterojunction Band Discontinuities: Physics and Device Applications", F. Capasso et al., editors, Elsevier 1987, especially pages 513–539, incorporated herein by reference.

Recently, "top-collector" RST devices were disclosed. See M. R. Hueschen et al., *Applied Physics Letters*, Vol. 57(4), p. 386; and K. Maezawa et al., *Japanese Journal of Applied Physics*, Vol. 30(6), p. 1190. In these devices the lateral extent of the collector is defined by lithography, and can consequently be small. Thus, the parasitic capacitance that is typically associated with conventional RST devices can be substantially reduced. However, the prior art top-collector devices present another problem. As those spilled in the art will appreciate, both source and drain contacts must be self-aligned with the collector, in order to avoid introduction of (speed-degrading) series resistance into the channel. However, alloying of such self-aligned contacts frequently degrades the integrity of the barrier layer, leading to an increase in undesirable parasitic leakage across the barrier.

In view of the many advantageous features of RST devices, including potentially high speed, it would be highly desirable to have available device geometries that can result in devices that are free of, or at least less subject to, some of the shortcomings associated with prior art geometries.

The potential speed advantage of an inverted ("collector-up") heterojunction bipolar transistor (HBT) structure over the conventional ("emitter-up") structure has long been recognized. See, for instance, H. Kroemer, *Proceedings of the IEEE*, Vol. 70(1), pp. 13–25 (1982); and C. G. Fonstad, *IEEE Electron Device Letters*, Vol. EDL-5(3), pp. 99–100 (1984). The advantage of the inverted structure results mainly from a reduction in the parasitic base-collector capacitance that is associated with the extrinsic base region.

Key to a successful implementation of a collector-up HBT is the reduction of the parasitic injection of minority carriers in the extrinsic base region. Several ways of accomplishing this have been proposed, including formation of a p-n junction in the wide-gap emitter layer by ion implantation (see H. Kroemer, op. cit.), and the formation of a buried isolation layer by $O^+$ implantation. See, for instance, H. Sato et al., *IEEE Electron Device Letters*, Vol. 11 (10), pp. 457–459 (1990). However, prior art approaches to the manufacture have not proven entirely successful. For instance, it has been found that by ion implantation techniques it is difficult to reliably eliminate the unwelcome injection of minority carriers into extrinsic regions of the base, not covered by the collector stripe. Thus, in view of the advantages that are potentially associated with HBTs of novel geometry, a method of making such devices that is not subject to the shortcomings of prior art techniques would be highly desirable. This application discloses such a method.

GLOSSARY AND DEFINITIONS

By "bulk" semiconductor material is meant herein material of the virgin semiconductor wafer.

"Epitaxial" semiconductor material herein is semiconductor material deposited on bulk material by epitaxial growth techniques such as CVD, MBE, VPE, LPE, and combinations thereof.

SUMMARY OF THE INVENTION

This application discloses a new semiconductor device fabrication method, to be referred to as "active packaging" or "AP". A particular embodiment of AP is used to manufacture HBTs of novel geometry, but the method is by no means limited to the manufacture of such HBTs. Indeed, the method of making a RST device that was disclosed in the parent of this continuation-in-part application can be considered to be a particular embodiment of AP. As those skilled in the art will recognize, other embodiments of AP permit implementation of semiconductor device structures that cannot realistically be implemented by prior art techniques. Exemplary of such device structures are those that require lithography on opposite sides of a thin (e.g., less than 10 μm) semiconductor film.

A general characteristic of AP is the performance of one or more essential fabrication steps (e.g., lithography, etching, metallization, etc.) after a partially processed device or circuit (the "intermediate" semiconductor body) is mounted on a carrier body such that the intermediate body is mechanically and electrically connected to the carrier body. Exemplarily the intermediate body is mounted on the carrier body by anisotropic conductor means. Such means are known and will herein be referred to as "consulator" means. The carrier body typically comprises conventional conductors that facilitate electrically contacting the mounted intermediate body, and/or the device or circuit produced therefrom. I will next discuss a particular embodiment of AP, namely, a method of making an article that comprises a novel RST device.

The method comprises providing a semiconductor body that comprises a bulk semiconductor substrate and a multiplicity of epitaxial semiconductor layers on a major surface of the substrate. The multiplicity of layers comprises, in sequence, a first semiconductor region, an essentially undoped second semiconductor region (comprising the barrier layer), and a third semiconductor region in contact with the barrier layer. The first semiconductor region comprises a layer having relatively high sheet carrier concentration (exemplarily $>10^{13}/cm^2$), and a layer having a relatively low sheet carrier concentration (exemplarily $<10^{13}/cm^2$). The former is the emitter contact layer, and the latter is the emitter layer. The emitter layer is in contact with the emitter contact layer and the barrier layer.

The method further comprises providing means for making electrical contact to the third semiconductor region, and providing at least two spaced apart means for making electrical contact to the emitter contact layer, each of these means comprising a contact metal pad.

Significantly, the method further comprises patterning the semiconductor body such that a, typically elongate, mesa structure of lateral width $W \leq 50$ μm is formed, the mesa structure comprising the third semiconductor region. The method still further comprises removing substantially all bulk semiconductor material from at least the active region of the device, and forming a, typically elongate, depressed feature (to be referred to as the trench), of width $L_{ch} \leq 5$ µm, in the active region of the device. The trench is caused to extend through the emitter contact layer to the emitter layer, such that the resulting two portions of the emitter contact layer are electrically connected substantially only through the (low conductivity) emitter layer, and is positioned such that the trench directly faces the mesa structure.

The method further comprises providing device carrier means that have a first major surface, with patterned conductive material on the first major surface, and affixing the partially processed RST device (the intermediate body) to the carrier means such that at least one of the three contact metal pads makes electrical contact with the patterned conductive material. Preferred means for affixing the partially processed RST device to the carrier means comprise a unidirectionally conductive interconnection medium (consulator means), exemplarily a metal particle-containing epoxy. The intermediate body is affixed to the carrier means prior to removal of the substrate material, with the carrier means providing mechanical support to the remaining epitaxial semiconductor material after substrate removal.

In a broader aspect, the invention is embodied in a novel method of making an article that comprises a semiconductor device. The method comprises providing a semiconductor body having a first and a second major surface and comprising bulk semiconductor material and epitaxial semiconductor material on the bulk material. The epitaxial material and bulk material define the first and second major surfaces, respectively. The method further comprises carrying out a first sequence of (typically conventional) processing steps on the epitaxial material, resulting in formation of an intermediate semiconductor body. The first sequence of processing steps comprises forming at least first and second contact means on the first major surface. The method still further comprises providing a carrier body having a major surface with third and fourth contact means thereon, and mounting the intermediate body to the carrier body such that the first major surface of the semiconductor body faces the major surface of the carrier body, and such that the first contact means are electrically connected to the third contact means and are substantially electrically isolated from the fourth contact means, and the second contact means are electrically connected to the fourth contact means and are substantially electrically isolated from the third contact means. The method also comprises carrying out a second sequence of processing steps on the semiconductor body, the second sequence comprising removing, in at least a portion of the second surface, essentially all bulk material by means that comprise exposing the second surface to an etching medium.

In an exemplary embodiment the method is used to make a novel III-V HBT (or a III-V semiconductor chip that comprises one or more active elements such as the novel HBTs) that is mounted on a Si carrier body, with the carrier body comprising conventional circuitry, in addition to the contact pads that are required to electrically connect the HBT (or III-V chip) to the Si chip.

Exemplary of articles produced by means of the novel process is a millimeter (or even sub-millimeter) wavelength phased-array antenna system on a Si chip. Such a circuit is highly desirable in a variety of applications, for instance, in wireless personal communication systems as well as in automobile collision avoidance systems.

BRIEF DESCRIPTION OF THE DRAWINGS

No attempt has been made to show realistic dimensions and/or proportions.

DETAILED DESCRIPTION OF SOME EXEMPLARY EMBODIMENTS

A particular embodiment of the instant invention is a method of making an RST device. The method will now be described with reference to a InGaAs/InP heterostructure grown on a InP substrate. This is for concreteness only, and those skilled in the art will recognize that other heterostructures (e.g., InGaAs/InAlAs, lattice matched to InP, GaAs/AlGaAs lattice matched to GaAs, or other lattice matched structures; as well as strained layer structures) can be utilized similarly. In general, the novel RST device can be embodied in any semiconductor system that permits attainment of the known bandgap relationships, provided there exists a composition in the system whose etch rate in an appropriate etching medium is substantially lower (typically at most 10%) of the etch rate of another composition in the system (typically the composition of the substrate material). If this condition is met than it will typically be possible to remove the substrate material from at least the active region of the device, as will be explained in more detail below.

It will be understood that, as is conventional, expressions such as InGaAs or InAlAs are not intended to designate the exact stoichiometry of a given material. For instance, InGaAs, lattice matched to InP, has stoichiometry $In_xGa_{1-x}As$, with x=0.53. Those skilled in the art know the stoichiometries that result in lattice match to the various possible substrates, as well as those that result in strained layer heterostructures.

Figure 8:
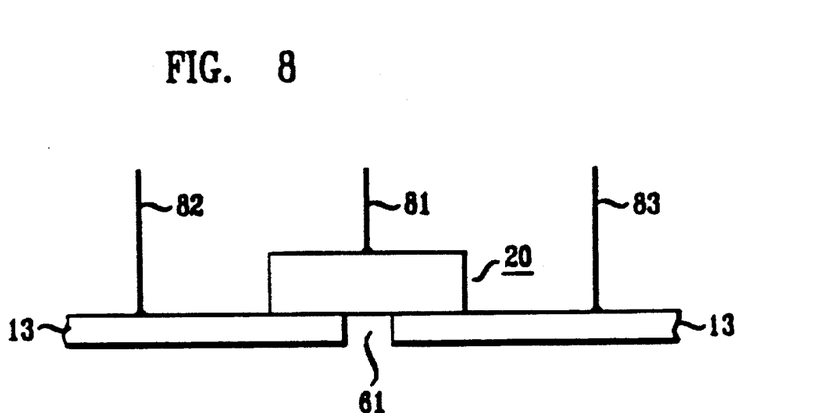
FIG. 8 schematically depicts the geometry of an exemplary device according to the invention.

FIG. 8 schematically depicts the geometry of an exemplary RST device according to the invention. Numerals 13 refer to the two portions of the emitter contact layer, 20 to the mesa structure that typically comprises emitter layer, barrier layer and collector (these are not separately shown), and 61 to the trench that separates the two portions of 13 such that the portions are electrically connected substantially only through the emitter layer. Numerals 81, 82 and 83 refer, respectively, to the collector contact and the two emitter contacts.

The semiconductor portions of the device shown in FIG. 8 consist substantially only of epitaxial semiconductor material. Those skilled in the art will appreciate that a device as shown would be exceedingly fragile, and at best difficult to manufacture by conventional techniques. Thus, in order to attain the benefits that potentially derive from the novel device geometry, a novel method of making the RST device is needed.

Figure 1:
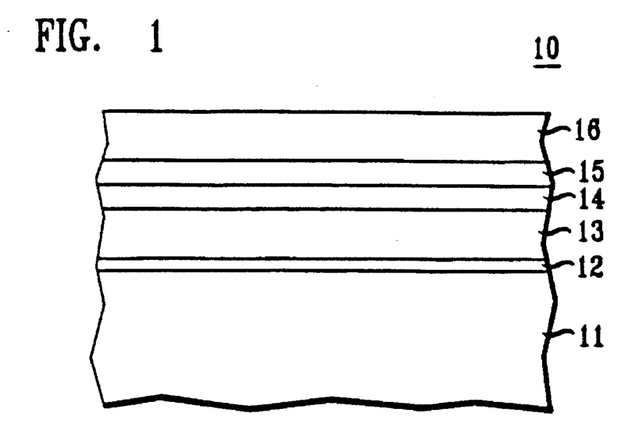
FIG. 1 schematically depicts an exemplary multilayer semiconductor structure that can be used in making a RST device according to the invention.

FIG. 1 schematically depicts an exemplary heteroepitaxial layer structure 10 that can be used in the practice of the invention. Numeral 11 designates a conventional single crystal bulk semiconductor substrate body, e.g., a semi-insulating InP wafer. On one of the two major surfaces of substrate body 11 are grown epitaxial layers 12–16 in conventional fashion. Exemplarily, layer 12 is a 100 nm $n^+$ InGaAs etch stop layer, 13 a 200 nm $N^{++}$ InP emitter contact layer, 14 a 40 nm n InGaAs emitter (channel) layer, 15 a 100 nm undopeal InP barrier layer, and 16 a multilayer collector structure (e.g., 100 nm $n^+$ InGaAs, followed by a 20 nm n++ InGaAs cap layer). It will be recognized that the above exemplary structure is conventional, and that such a structure may in some cases contain more layers, e.g., two etch stop layers. Furthermore, it will be recognized that the collector layer may be, but need not be, chemically homogeneous. For instance, if the desired RST device is a light emitting device then layer 16 typically is not chemically homogeneous, and will contain dopants of opposite polarity from those in the emitter. See, for instance, S. Luryi, *Applied Physics Letters*, Vol. 58(16), p. 1727.

In a further exemplary embodiment, layer 12 is a $n^{++}$ 100 nm InGaAs etch stop/emitter contact layer, and 13 is a second etch stop layer (2.5 nm $n^+$ InP or InAlAs).

Figure 2:
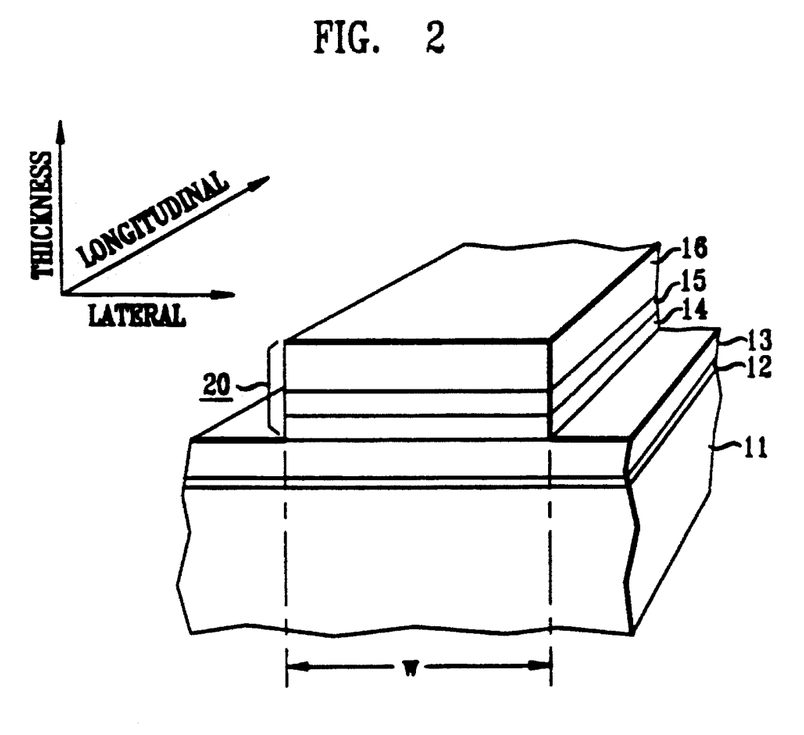
FIGS. 2–5 schematically illustrate intermediate stages in making of the exemplary RST device.

The exemplary heteroepitaxial layer structure 10 is processed by conventional means to form a mesa 20 of width W, as shown schematically in FIG. 2. As is shown in the figure, the width is measured in the lateral direction. Those skilled in the art will appreciate that the mesa's extent in the longitudinal direction (i.e., in the direction that is normal to the lateral direction and is parallel to the major surface of the substrate) frequently, but not necessarily, is greater than its width. This is conventional. FIG. 2 also indicates the third direction associated with the device geometry, namely, the direction in which thicknesses are measured. It will be appreciated that in RST devices having more than two emitter contacts (not necessarily arranged in linear fashion), the trench is not necessarily a linear feature.

Figure 3:
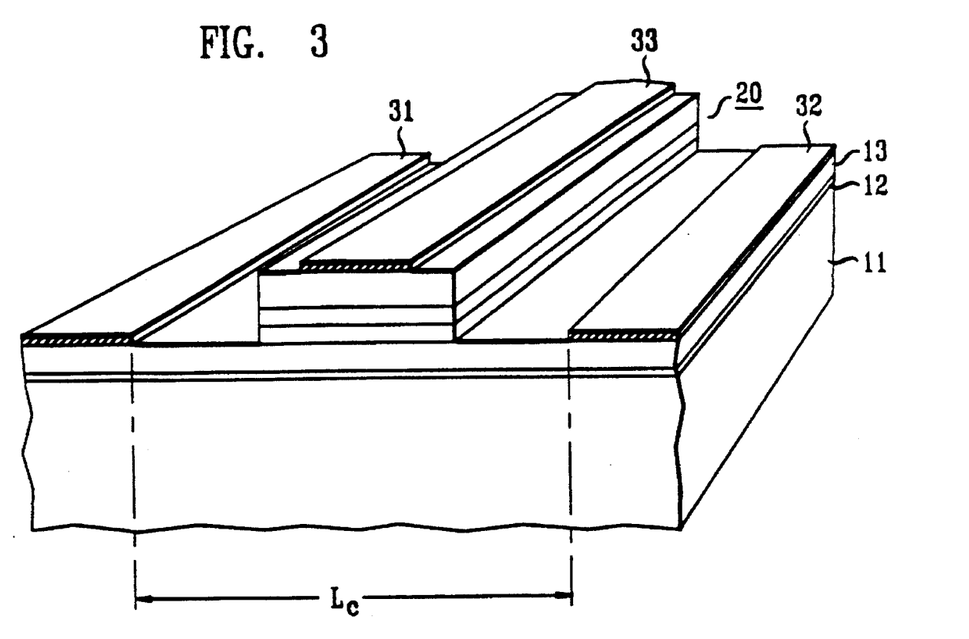

In the exemplary embodiment emitter and collector contacts (typically ohmic contacts) are applied subsequent to mesa formation by conventional means. The resulting structure is schematically shown in FIG. 3, wherein numerals 31 and 32 refer to the emitter contacts (spaced a distance $L_c$ apart), and numeral 33 refers to the collector contact.

Subsequently an appropriate dielectric layer (e.g., $Si_3N_4$) is deposited over the patterned heterostructure, vias are formed, and a final metal pattern (e.g., Au or Al) deposited, all in conventional fashion. The resulting structure is schematically shown in FIG. 4, wherein numerals 41 refer to the dielectric layer, numerals 42 and 43 refer to the emitter contact pads, and 44 refers to the collector contact pad.

Figure 4:
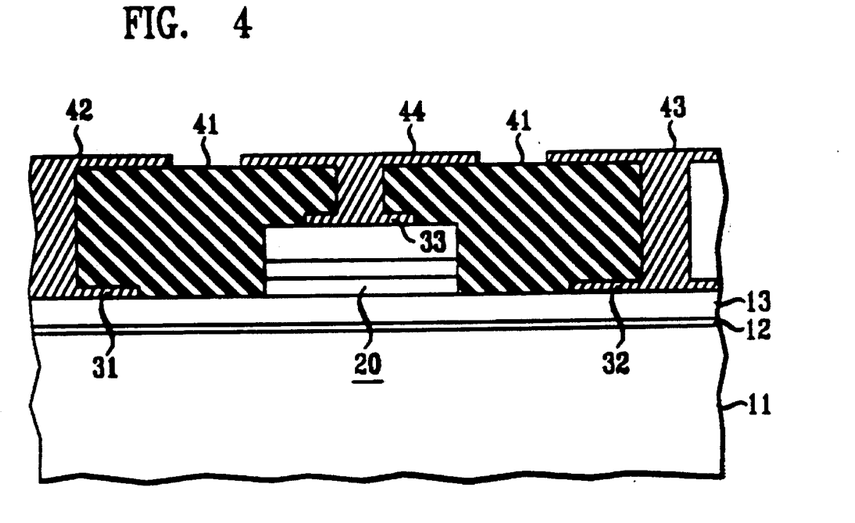

Those skilled in the art will recognize that the intermediate body of FIG. 4 cannot yet function as an RST device, since highly conducting emitter contact layer 13 shorts the emitter layer 14, preventing significant carrier heating. It is an objective of processing steps subsequent to the above described processing to cut a trench through contact layer 13 from below (i.e., from the "substrate side"), thereby defining the effective channel length $L_{ch}$ of the resulting RST device. This can be accomplished as follows.

The intermediate body (either as part of a wafer, or as a separate device structure, after appropriately dividing a wafer in known fashion) is mounted mesaside down on an appropriate carrier body. The carrier body can comprise any suitable material, including multilayer ceramics, Si or polymer, but preferably comprises material whos thermal expansion coefficient is close to that of the epitaxial semiconductor material. The carrier body typically is in wafer form, having two parallel major surfaces. On one of the major surfaces are contact pads that are arranged in mirror fashion with regard to those on the surface of the intermediate body. Appropriate conductor lines (preferably buried) connect the contact pads to appropriately placed contacts (typically at the periphery of the carrier body) that facilitate electrically contacting the contact pads. Carrier bodies of the contemplated type are known (see, e.g., U.S. Pat. No. 4,675,717), and are used in "wafer-scale integration" interconnect technology.

Mounting of the intermediate body on the carrier must be such that the relevant contact pads on the carrier body are electrically connected to the corresponding pads on the surface of the multilayer structure, while providing isolation between non-corresponding pads. Furthermore, the mounting must be such that the resulting assembly can tolerate the subsequent processing. Optionally, the substrate portion (11) of the multilayer structure can be mechanically or chemically thinned (e.g., by polishing) prior to mounting or subsequent thereto. This can be done by known methods.

Figure 5:
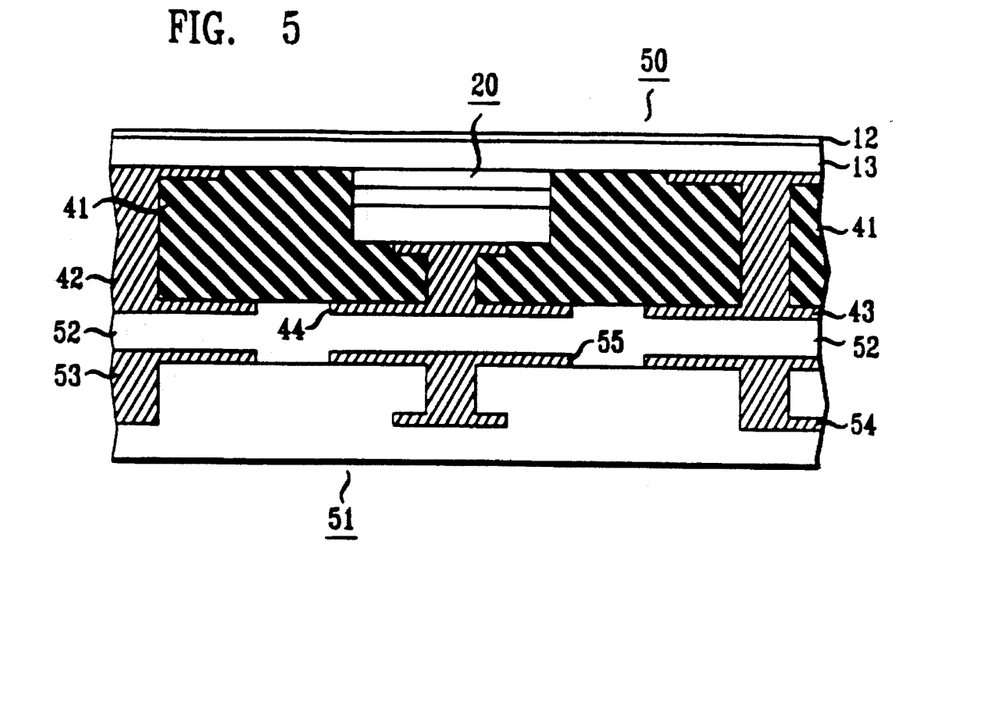

The multilayer structure can be mounted on the carrier body by any appropriate method, e.g., by the known means of solder bumps. A currently preferred mounting method uses a unidirectionally conducting interconnection medium ("consulator") of a type described in, for instance, U.S. patent application Ser. No. 08/061,753, which is a continuation-in-part of application Ser. No. 07/755,704, "Surface Mount Assembly of Devices Using AdCon Interconnection", filed Sep. 6, 1991 for D. W. Dahringer et al., now abandoned. Subsequent to mounting the multilayer structure on the carrier body, the remaining substrate (bulk) material (11) is removed, typically by etching. A suitable etch for removal of InP material is $3HCl+1H_2O_2+5H_2O$. As is well known, this etch is extremely selective between InP and InGaAs. Thus, etching essentially ceases at the InGaAs etch stop layer 12, resulting in an assembly 50 as depicted schematically in FIG. 5. Numeral 51 refers to the carrier body, 52 to the unidirectionally conducting medium which provides electrical continuity between corresponding contact pads 53 and 42, 54 and 43, and 55 and 44, but provides open circuits between non-corresponding contact pads (e.g., 54 and 44). As FIG. 5 schematically indicates, buried conductor lines connect contact pads 53–55 to the periphery of the carrier body.

Figure 6:
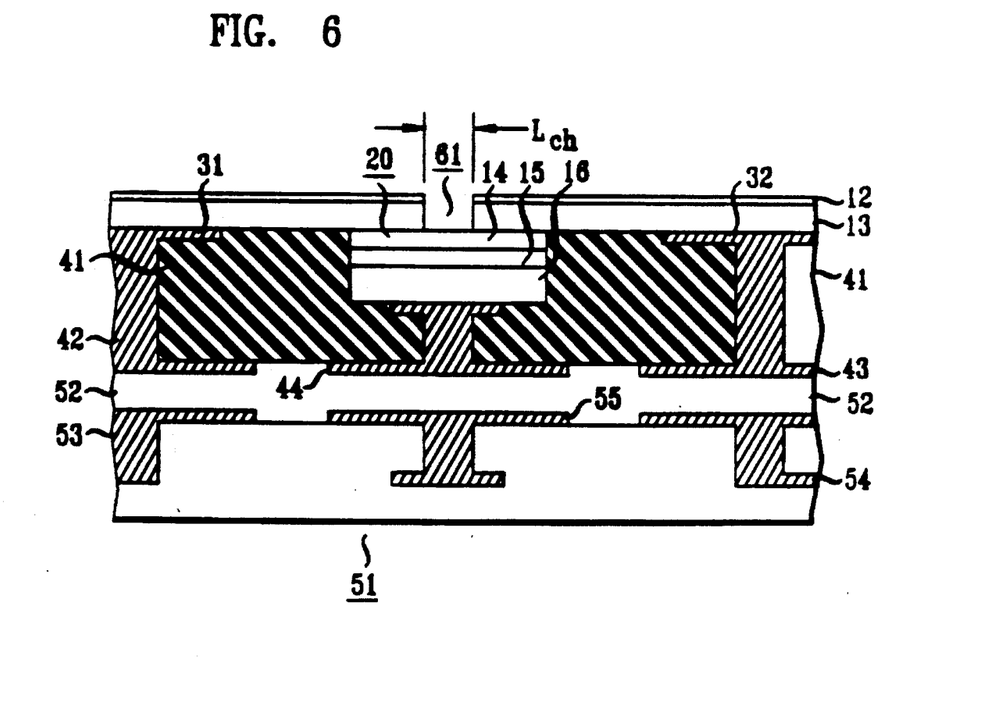
FIG. 6 shows schematically the exemplary RST device affixed to device carrier means, with substrate material removed from the device and a trench etched through the emitter contact layer.

Substrate removal is followed by trench lithography and etching, all by conventional means, as schematically depicted in FIG. 6. Trench 61 has width $L_{ch}$ in the lateral direction and makes possible heating of carriers by application of an appropriate voltage between emitter contacts 31 and 32. Those skilled in the art will appreciate that $L_{ch}$ corresponds to the effective channel length. The spacing $L_c$ between the emitter contacts is much larger than $L_{ch}$. Exemplarily the former is greater than 5 μm, even greater than 10 μm, and the latter is less than or equal to 1 μm. Furthermore, the width of the mesa (W) is greater than $L_{ch}$, and is generally less than $L_c$. This device geometry can result in desirable device characteristics, e.g., in reduced parasitic capacitance, as compared to prior art geometries.

Figure 7:
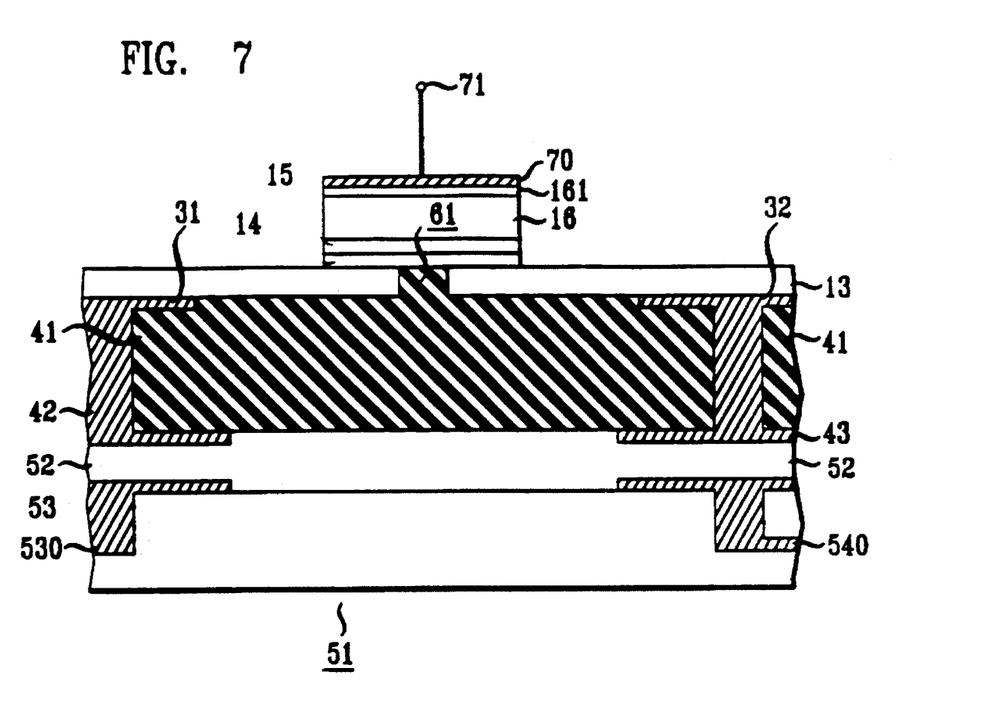
FIG. 7 schematically depicts a further exemplary RST device according to the invention, also affixed to device carrier means.

Modifying the disclosed method as required (e.g., by forming the trench prior to mounting of the intermediate body on a device carrier and by forming the mesa after removal of the bulk semiconductor material), a device as shown schematically in FIG. 7 can be made. In FIG. 7, numeral 51 refers again to the device carrier, with 530 and 540 referring to metal pads with buried conductor lines, 52 is again a unidirectionally conductive adhesive layer, 41 an appropriate dielectric layer (e.g., silicon nitride), 42 and 43 emitter contact pads, 31 and 32 emitter contacts, 13–16 emitter contact layer, barrier layer and collector, respectively. Numeral 161 refers to a $n^{++}$ InGaAs cap layer, 70 to a metal contact, and 71 to means for making electrical contact to the collector.

Next I will illustrate the novel process by means of another embodiment, namely, making an article that comprises a novel HBT.

Figure 9:
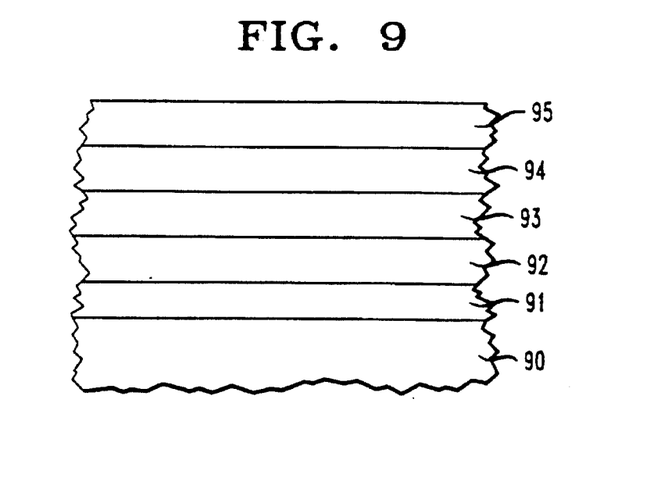
FIG. 9 schematically depicts the layer sequence for an exemplary HBT according to the invention.

Fabrication begins with provision of a III-V body (typically a wafer) having the structure shown schematically in FIG. 9, wherein numeral 90 refers to the (bulk) InP substrate, and numerals 91–95 refer, respectively, to epitaxial layers. In particular, layer 91 is a $n^+$ InGaAs emitter contact layer, 92 a n InP emitter layer, 93 a $p^+$ InGaAs base layer, 94 a $n^-$ InGaAs subcollector layer, and 95 a $n^+$ InGaAs collector layer. Layer 91 also serves as etch stop layer. Those skilled in the art will recognize that FIG. 9 is very schematic and does not show known features that may result in improved device performance. For instance, the base/collector junction may have composite structure for optimization of microwave properties and higher breakdown voltage. See, for instance, A. Feygenson et al., *IEDM Technical Digest*, pp. 75–78 (1992). A possible novel feature is a Schottky collector, to be discussed in detail below.

Next the first sequence of processing steps is carried out on the epitaxial material, i.e., on the first surface of the III-V body. The steps in themselves typically are known and conventional, and exemplarily include metallization and etching of the collector stripe down to the base layer, evaporation and alloying of self-aligned contacts to the base, deposition of a passivating dielectric (e.g., $Si_3N_4$), etching of via holes in the dielectric, and metallization. Ion implantation in the base area outside of the collector stripe is contemplated. Such implantation can result in formation of a p-n junction in that area in the (wide-gap) layer 92. The metal layer is patterned to provide the desired conducting paths and connector pads, typically connecting different devices in a circuit that has a relatively small number of communication points with the outside world.

Subsequent to patterning of the metallization layer the surface typically is covered by another ("interlevel") dielectric layer (e.g., polyimide), and the appropriate communication points are connected to "top" metal pads through a second set of via holes. The top pads may be relatively wide (e.g., $\geq 100$ μm) to facilitate alignment with the corresponding pads on the carrier body, and the interlevel dielectric may be planarized.

Figure 10:
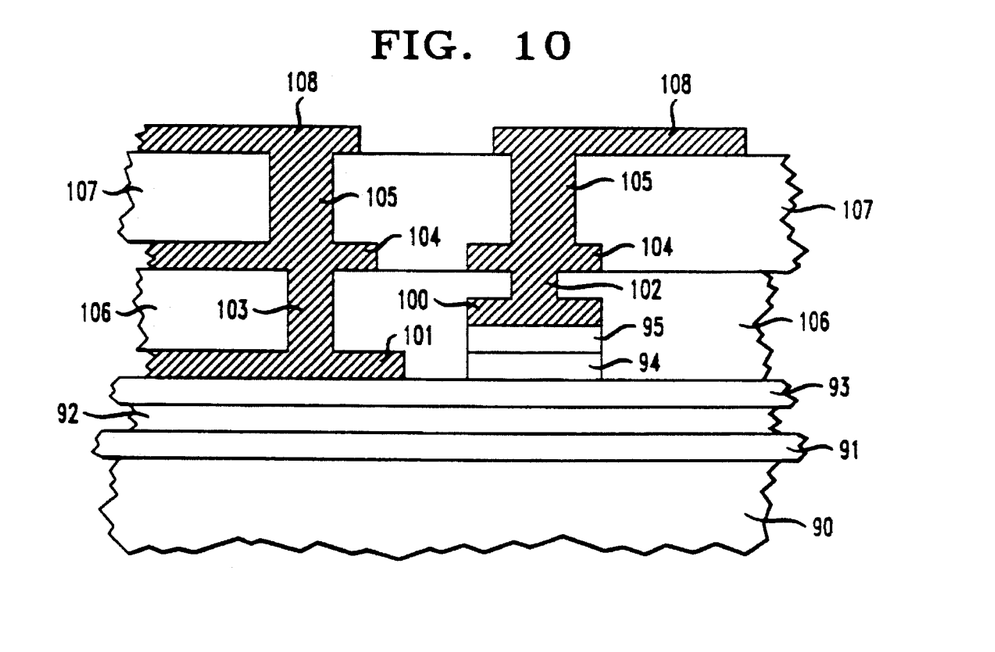
FIGS. 10–12 schematically show stages in an exemplary process of making an article according to the invention, namely, a III-V HBT.

The resulting intermediate body is schematically shown in FIG. 10, wherein numerals 100 and 101 refer to the collector and base contact, respectively, numerals 102 and 103 refer to filled via holes in passivating dielectric layer 106, numerals 104 refer to the patterned metal, numerals 105 refer to filled via holes in "interlevel" dielectric 107, and numerals 108 refer to the "top" metal pads.

The thus produced intermediate body is mounted face down (i.e., first major surface facing the carrier body) on a "carrier" body which comprises contact pads disposed so as to substantially form a mirror image of top metal pads 108 on the intermediate body, including a mirror image of recesses and/or elevations, if such are present. The carrier body may consist of any appropriate material, or materials (e.g., glass, ceramics, a bare Si wafer or pan of a bare Si wafer), but a Si wafer that has already undergone conventional IC processing is the currently preferred carrier body.

The intermediate body is mounted on the carrier body by means of a "consulator" film, or any other appropriate means, e.g., solder bumps, especially solder bumps in conjunction with insulating material that fills the remaining space between the carrier body and the III-V body. For more detail, see K. W. Goossen et al., *IEEE Photon. Technol. Letter*, Vol. 5, pp. 776–778 (1993), incorporated herein by reference.

A consulator film is currently preferred because it not only provides electrical connection between corresponding connector pads and isolation between non-corresponding pads but also can provide a stable mechanical support for the completed III-V body mounted on the carrier body. Exemplary of consulator films are anisotropically conductive adhesive films. Anisotropically conductive adhesives are known to those skilled in the art.

Other examples of potentially useful consulator films are organic polymers (e.g., atactic polypropylene) that can be processed (including oxidation and UV irradiation) to exhibit high conductivity in the direction normal to the film while remaining essentially insulating in the lateral direction. See, for instance, V. M. Arkhangorodskii et al., *JETP Letters*, Vol. 51, pp. 67–72 (1990).

Figure 11:
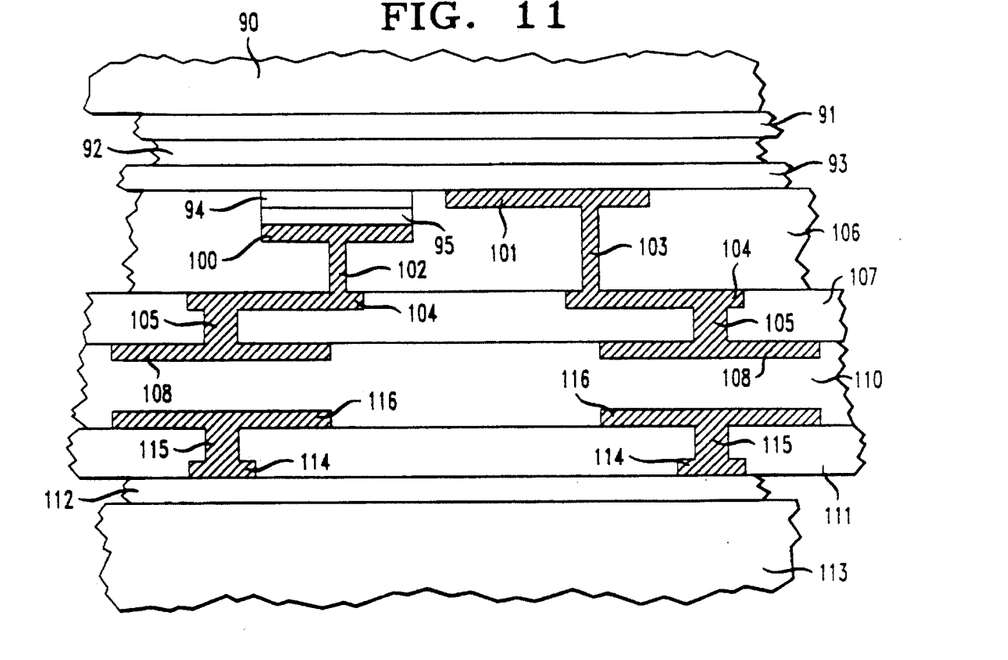

FIG. 11 schematically depicts a portion of an exemplary combination of a carrier body and of an intermediate body mounted thereon. Numeral 113 designates a Si wafer, and 112 refers to conventional integrated circuitry (not shown in detail) formed on the wafer. Appropriately placed contact pads 114 are provided. Filled via holes 115 through conventional passivating layer 111 provide electrical connection between the circuitry on wafer 113 and top metal pads 116. Numeral 110 refers to the consulator layer, which completes the electrical connection between the base of the HBT and the circuitry on wafer 113 on the one hand, and the collector of the HBT and the circuitry on wafer 113 on the other hand.

After appropriate mounting of the intermediate body on the carrier body, the bulk semiconductor material is removed from at least a portion of the intermediate body such that essentially only epitaxial III-V material remains in that portion. Typically all of the bulk material will be removed. Removal typically is by a process that may optionally comprise mechanical polishing, and that will comprise chemical etching with etching means having high selectivity between the bulk semiconductor material and the epitaxial III-V material thereon. For instance, a known HCl-based chemical etch has high selectivity between InP and InGaAs. Although emitter contact layer 91 can serve as etch stop layer, it may be desirable to provide a pair of sacrificial InGaAs/InP layers between the bulk material 90 and the emitter contact layer 91. The presence of such a sacrificial pair may result in improved planarity of the resulting epitaxial material surface, which facilitates subsequent fine line lithography on the surface. Unless the attachment means are substantially inert with respect to the etching medium, it may be desirable to provide means for preventing contact between the attachment means (e.g., the consulator film) and the etching medium. Such protection of the attachment means is well within the skill of the artisans.

Subsequent to the removal of the bulk semiconductor material (and, optionally, of the sacrificial layer pair), one or more processing steps are carried out on the newly formed epitaxial III-V semiconductor material surface. Exemplarily the processing steps comprise deposition of a processing layer, photolithography and etching, or other conventional steps. In view of the extreme thinness of the mounted semiconductor body (exemplarily about 1 µm to about 5 µm), it will typically be relatively easy to position features on the "top" surface of the mounted body with respect to existing features on the "bottom" surface thereof. Exemplarily, base contact 101 may be seen with sufficient contrast to serve as positioning guide. The processing steps comprise patterning of layers 91 and 92 (e.g., by means that comprise conventional evaporation and lift-off of a suitable metal, e.g., Al), such that the desired emitter structure results. The emitter stripe and collector stripe can, but need not, be of substantially the same width. Typically they will differ in width by less than about 0.5 µm, with the narrower one completely overlapping the wider one.

Figure 12:
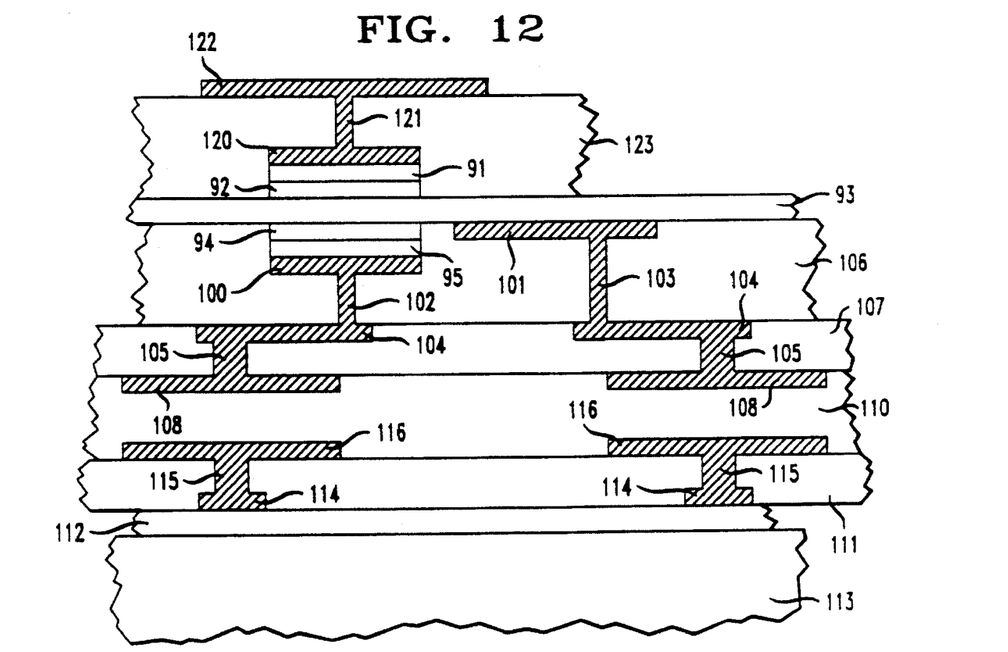

It is known that ohmic contacts to, e.g., $n^+$ InGaAs can be formed without alloying. Desirably, the processing sequence does not involve any high temperature treatment, to avoid possible damage to, e.g., the consulator film. Passivating dielectric (e.g., $Si_3N_4$, polyimide) is deposited at or close to room temperature, via holes are opened through the dielectric, and the final metal is deposited and patterned. The resulting structure is schematically depicted in FIG. 12, wherein numerals 120–122 refer to the emitter contact metal, filled via hole and top emitter contact, respectively, and 123 refers to the passivating dielectric. The top emitter contact may be connected to ground level or to any other point of the circuitry, as required. Such connection to the rest of the circuit may go across the periphery of the chip, or via the consulator film, and is not shown in FIG. 12.

Figure 13:
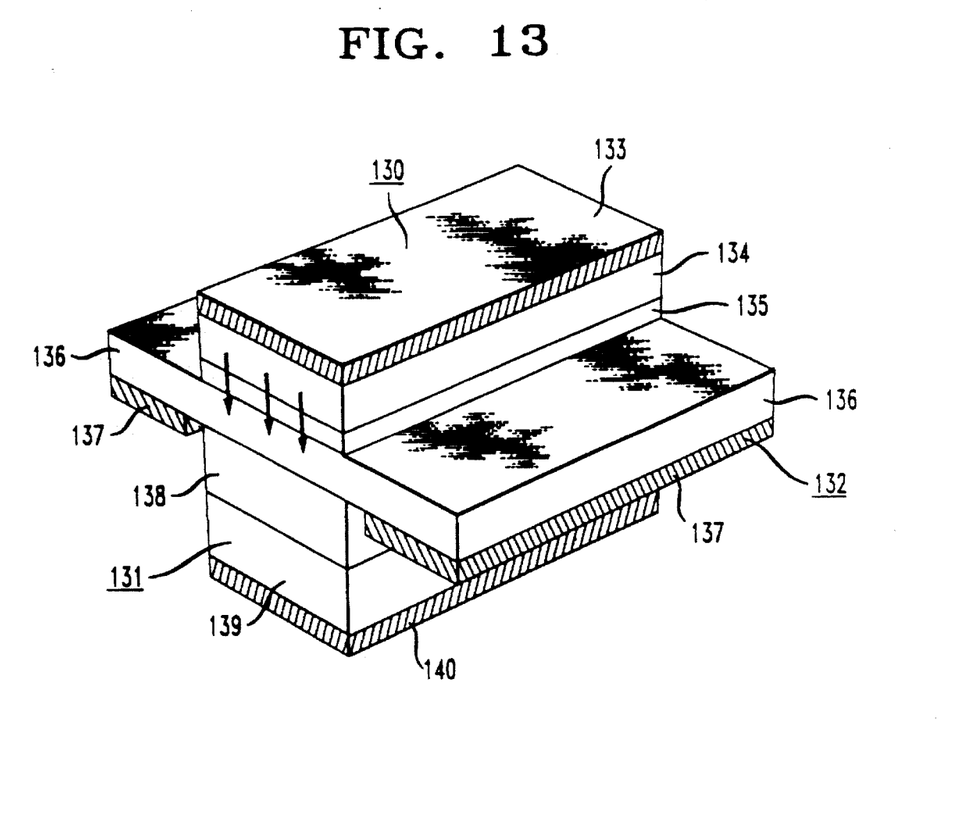
FIG. 13 schematically depicts an HBT according to the invention.

FIG. 13 schematically depicts an exemplary HBT, without the associated carrier body and circuitry. Numerals 130–132 refer to the emitter stripe, collector stripe and base, respectively, numerals 133–135 to emitter metal contact (e.g., AuGe/Au), emitter semiconductor contact layer (e.g., $n^+$ InGaAs) and emitter layer (e.g., InP), respectively, numerals 136 and 137 to base layer (e.g., $p^+$ InGaAs) and base metal contacts (e.g., AuBe/Au) respectively, and numerals 138–140 to subcollector layer (e.g., $n^-$InGaAs), collector layer (e.g., $n^+$InGaAs), and collector metal layer (e.g., AuGe/Au). Since both emitter and collector stripes are defined by independent lithographic steps and are aligned to each other, it is substantially immaterial which stripe is "up" in the completed article. The distinction whether the collector layer is "up" or "down" in the epitaxial layer sequence becomes, however, significant in the following embodiment of the inventive method.

Figure 14:
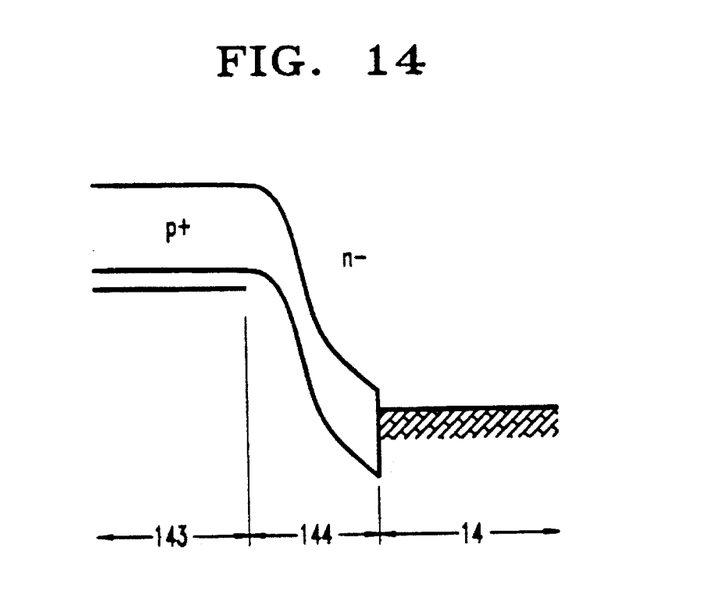
FIG. 14 shows relevant aspects of a band diagram for a Schottky collector HBT.

The inventive method can be used to make HBTs that have a Schottky collector. It is known that an important parasitic resistance in small area devices is due to the metal/semiconductor junction. Since the resistance of a conventional ohmic contact scales with the area of the contact, for small enough contacts this resistance must dominate over other resistances that scale with the circumference of the contact. In a HBT of the type shown in, for instance, FIG. 13, the collector contact area can be so small that the parasitic resistance associated with a conventional metal/semiconductor junction is significant. Thus, it will frequently be desirable to dispense with the, conventionally used, $n^+$ doped semiconductor layer in the emitter (e.g., layer 95 in FIG. 9) and use a Schottky collector, schematically illustrated in FIG. 14 by means of a conventional band diagram. In FIG. 14, reference numeral 14 refers to the contact metal, and numerals 143 and 144 refer to the base and subcollector layer, respectively. For the implementation of a Schottky collector HBT it is essential that the emitter layer precedes the base layer in the epitaxial growth sequence, since it is relatively easy to deposit a metal over an epitaxial semiconductor layer, while growing an epitaxial semiconductor layer over a metal layer is typically not practical.

Articles produced according to the inventive method can find use in a variety of applications. For instance, model calculations show that a HBT as described herein can operate at 300 GHz and even higher frequencies, especially if the HBT has a base bandgap that narrows down toward the collector in a multiplicity of substantially discontinuous steps (in this regard see co-assigned U.S. patent application Ser. No. 08/052,352, filed Apr. 23, 1993). Thus, an exemplary article according to the invention is a satellite communication system that operates in the atmospheric transmission window of about 345 GHz and comprises receiver means that comprise a local oscillator and/or an amplifier that comprises a HBT produced according to the invention. Such a satellite communication system could be substantially like prior art systems except for the presence of the novel HBT or HBTs, and the features required to adapt the system to the higher frequency.

Another possible article according to the invention is a phased array antenna system that is implemented on a Si chip, as facilitated by the disclosed AP technology. Phased arrays are known. See, for instance, R. Tang et al., *Proceedings of the IEEE*, Vol. 80, pp. 173–182 (1992).

As is well known, a phased array system needs low noise amplifiers at each element and high power amplifiers at least at each subarray. Local placement of these amplifiers reduces the antenna loss on transmit and enhances the signal-to-noise ratio on receive. The closer the amplifiers are placed to the radiating elements the better is the antenna performance. With the AP technology, the entire system can be placed on a silicon chip. A λ/2 spaced linear array of 20 elements radiating at 300 GHz would be about a centimeter long. The advantage of having transistor oscillators is that the millimeter-wave beam can be electrically steered off broadside by controlling the relative amplitudes of different oscillators, while their relative phases are locked together by evanescent wave interaction. Most prior art phase shifters used in centimeter wave phased array systems are bulky elements that cannot be used in on-chip designs. Instead, a system according to the invention uses electronic beam steering by controlling the amplitude of constant-phase array elements. Such a technique has been discussed theoretically by J. P. Costas, *Proc. IEEE*, Vol. 69, pp. 745–747 (1981), but as far as I am aware, has not been employed in practical phased-array antenna systems, because at centimeter wavelengths it is more efficient to control the relative phases of array elements. However, in the millimeter and submillimeter wavelength range amplitude steering appears to be the only realistic way of purely electronic beam steering. Three-terminal devices as disclosed herein are ideally suited for amplitude beam steering. Such transmit and receive antenna arrays should have important applications as steerable radar systems in, e.g., avionics, automated manufacturing, and especially in automobile collision avoidance and early warning systems. Although it is recognized that beam steering can also be accomplished by mechanical means as well as optoelectronic means (for example, N. Froberg et al. *Applied Physics Letters*, Vol. 58, pp. 446–448 (1991) recently demonstrated a steerable photoconducting antenna array at submillimeter wavelengths), it is expected that purely electronic means for beam steering will prove to be a more convenient and versatile technique.

I claim:

1. Method of making an article that comprises a semiconductor device, the method comprising
   a) providing a semiconductor body having substantially parallel first and second major surfaces and comprising bulk semiconductor material and epitaxial III-V semiconductor material on said bulk material, said epitaxial material forming said first major surface, and said bulk material forming said second major surface;
   b) carrying out a first sequence of processing steps on said semiconductor body comprising forming at least first and second contact means on the first major surface, the resulting partially processed semiconductor body to be referred to as the "intermediate" body;
   c) providing a carrier body having a major surface with third and fourth contact means thereon;
   d) mounting the intermediate body on the carrier body such that said first major surface is facing the carrier body major surface, with said first contact means electrically connected to said third contact means and not electrically connected to said fourth contact means, and with said second contact means electrically connected to said fourth contact means and not electrically connected to said third contact means; and
   e) carrying out a second sequence of processing steps on the intermediate body comprising removing, from at least a portion of the second surface, essentially all bulk semiconductor material such that said second surface comprises epitaxial III-V semiconductor material, and further comprising providing means for electrically contacting said epitaxial III-V semiconductor material in said at least portion of the second surface, wherein
   f) step d) comprises mounting the intermediate body on the carrier body by means that comprise anisotropic conductor means.

2. Method of claim 1, wherein the semiconductor device is a heterojunction bipolar transistor comprising an emitter layer and an emitter stripe having a width, a base region, and a collector layer and a collector stripe having a width.

3. Method of claim 2, comprising removing epitaxial III-V semiconductor material such that the difference in width of said emitter and collector stripes is at most 0.5 μm.

4. Method of claim 3, comprising removing epitaxial III-V semiconductor material such that the width of the emitter stripe is substantially equal to the width of the collector stripe.

5. Method of claim 2, wherein associated with the semiconductor material of the base region is a band gap that monotonically decreases in width in the direction from the emitter layer towards the collector layer.

6. Method of claim 2, wherein the collector stripe comprises a $n^-$ collector layer in contact with a contact metal layer.

7. Method of claim 1, wherein said anisotropic conductor means comprise anisotropically conductive adhesive means.

8. Method of claim 1, wherein the carrier body comprises a silicon body that comprises electrical conductor means.

* * * * *